United States Patent
Knall et al.

(10) Patent No.: US 6,704,235 B2
(45) Date of Patent: Mar. 9, 2004

(54) ANTI-FUSE MEMORY CELL WITH ASYMMETRIC BREAKDOWN VOLTAGE

(75) Inventors: N. Johan Knall, Sunnyvale, CA (US); James M. Cleeves, Redwood City, CA (US); Igor G. Kouznetsov, Santa Clara, CA (US); Michael A. Vyvoda, Fremont, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 20 days.

(21) Appl. No.: 10/027,466

(22) Filed: Dec. 20, 2001

(65) Prior Publication Data

US 2003/0026158 A1 Feb. 6, 2003

Related U.S. Application Data

(63) Continuation-in-part of application No. 09/918,307, filed on Jul. 30, 2001.

(51) Int. Cl.[7] .............................................. H01L 29/04
(52) U.S. Cl. .................... 365/225.7; 257/528; 257/529; 257/530
(58) Field of Search ....................... 365/225.7; 257/530, 257/528, 529

(56) References Cited

U.S. PATENT DOCUMENTS

| 5,565,703 | A | 10/1996 | Chang |
|---|---|---|---|
| 5,573,970 | A | 11/1996 | Pramanik et al. |
| 6,251,710 | B1 | 6/2001 | Radens et al. |
| 6,420,215 | B1 * | 7/2002 | Knall et al. .................. 438/131 |

OTHER PUBLICATIONS de Graaf et al., "A Novel High–Density Low Cost Diode Programmable Read Only Memory," IEDM Tech. Dig., pp. 7.6.1–7.6.4 (1996).

"Anti–Fuse Memory Cell with Asymmetric Breakdown Voltage," U.S. patent application Ser. No. 09/918,307, filed Jul. 30, 2001; Inventors: N. Johan Knall, Igor G. Kouznetsov, and Michael A. Vyvoda.

Office Action Directed Against U.S. patent application Ser. No. 09/918,307, 6 pages, Oct. 4, 2002.

* cited by examiner

Primary Examiner—Son T. Dinh
(74) Attorney, Agent, or Firm—Brinks Hofer Gilson & Lione

(57) ABSTRACT

A memory cell for a two- or a three-dimensional memory array includes first and second conductors and set of layers situated between the conductors. This set of layers includes a dielectric rupture anti-fuse layer having a thickness less than 35 Å and a leakage current density (in the unruptured state) greater than 1 mA/cm$^2$ at 2 V. This low thickness and high current leakage density provide a memory cell with an asymmetric dielectric layer breakdown voltage characteristic. The antifuse layer is formed of an antifuse material characterized by a thickness $T_{minlife}$ at which the antifuse material is ruptured by a minimum number of write pulses having a polarity that reverse biases diode components included in the memory cell. The average thickness T of the antifuse layer is less than the thickness $T_{minlife}$.

39 Claims, 10 Drawing Sheets under reverse bias. Poly silicon diodes have a higher leakage than single-crystal diodes due to carrier generation in the depletion region. For this reason, unruptured anti-fuse layers used with poly silicon diode components preferably are

ANTI-FUSE MEMORY CELL WITH ASYMMETRIC BREAKDOWN VOLTAGE

CROSS REFERENCE TO RELATED APPLICATIONS

This application is a continuation in part of copending U.S. patent application Ser. No. 09/918,307, filed Jul. 30, 2001, the entirely of which is hereby incorporated by reference.

This application is also related to U.S. patent application Ser. No. 09/918,853, filed Jul. 30, 2001, entitled "Process for Fabricating Dielectric Film Using Plasma Oxidation," the entirety of which is hereby incorporated by reference.

BACKGROUND

This invention relates to anti-fuse memory cells, and in particular to improved anti-fuse memory cells that are more resistant to unintended anti-fuse rupture.

A memory array conventionally includes a two-dimensional or three-dimensional array of memory cells. One type of known memory cell includes an anti-fuse layer and diode components in each memory cell. Individual memory cells are interconnected between conductors, often known as word lines and bit lines. The anti-fuse layer is initially intact, but it can be ruptured or broken by applying a sufficient voltage across the memory cell. For example a write signal Vpulse is applied across a memory cell at the intersection of selected word lines and bit lines, and this write signal is maintained for a time Tpulse. The values of Vpulse and Tpulse are chosen such that the anti-fuse layer ruptures, and a high conductivity state of the memory cell is established. For many anti-fuse materials, the relation between Tpulse and Vpulse required for anti-fuse rupture is such that if Vpulse is increased, Tpulse can be decreased, and vice versa.

When the programming pulse Vpulse is applied to the selected memory cell, it is important to control the voltage applied across unselected cells to ensure that current leakage through these unselected cells does not lead to unintentional rupture of the unselected anti-fuse layers, or to an excessive voltage drop in the selected word and bit lines before the selected anti-fuse layer has ruptured. The voltage Vclamp across the memory cells at the intersection of two unselected lines (unselected cells) during the programming pulse can be a substantial fraction of Vpulse. The clamp voltage Vclamp is applied in the reverse bias direction across unselected cells during programming of each selected cell. Hence, an unselected cell should be capable of enduring Vclamp without rupture of the unselected anti-fuse layer for a time period substantially longer than Tpulse (depending upon the size of array).

SUMMARY

By way of general introduction, the preferred embodiments described below include a memory cell including an anti-fuse layer and two diode components, wherein the anti-fuse layer ruptures at a higher reverse-bias voltage than forward-bias voltage. In these embodiments, the anti-fuse layer provides a relatively high anti-fuse current leakage density prior to anti-fuse rupture. Preferably, the anti-fuse current leakage density matches the diode current leakage under reverse bias. Poly silicon diodes have a higher leakage than single-crystal diodes due to carrier generation in the depletion region. For this reason, unruptured anti-fuse layers used with poly silicon diode components preferably are characterized by a high conductivity or leakage current density. This can be achieved by using an anti-fuse layer with a thickness below a predetermined value or by forming the anti-fuse layer from materials with high current leakage rates prior to anti-fuse rupture.

The foregoing sections have been provided by way of general introduction, and they are not intended to narrow the scope of the following claims.

DETAILED DESCRIPTION OF PREFERRED EMBODIMENTS

The following detailed description will first provide a general discussion of memory cells including anti-fuse layers that are matched in conductivity to the associated diode components (when reverse biased prior to anti-fuse rupture). This description will then turn to a detailed description of preferred embodiments of the present invention.

GENERAL DISCUSSION

Figure 8:
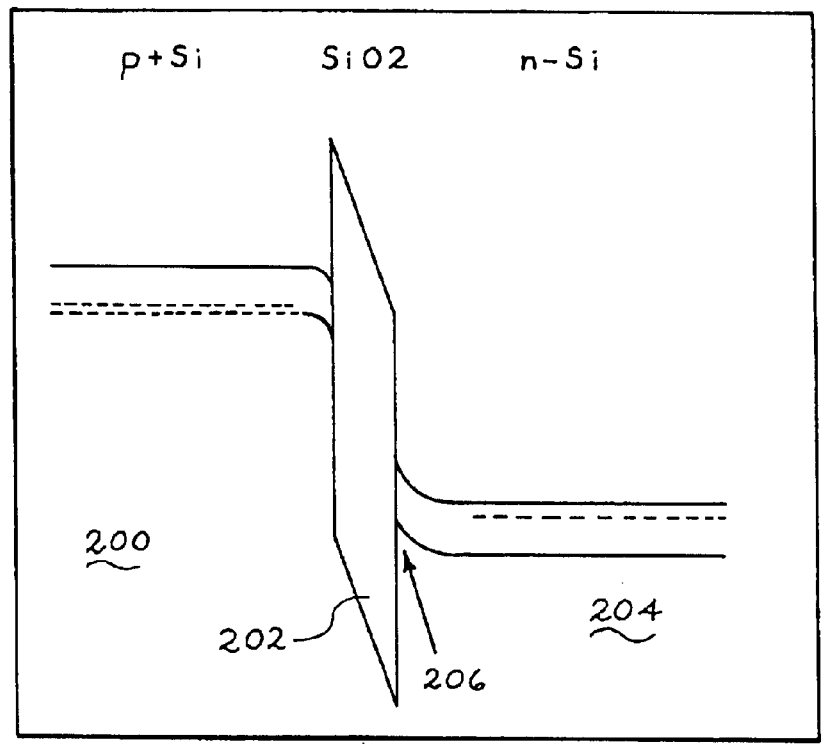
FIGS. 8 and 9 are schematic diagrams used to describe memory cells having a low-leakage anti-fuse layer and a high-leakage anti-fuse layer, respectively.
Figure 9:
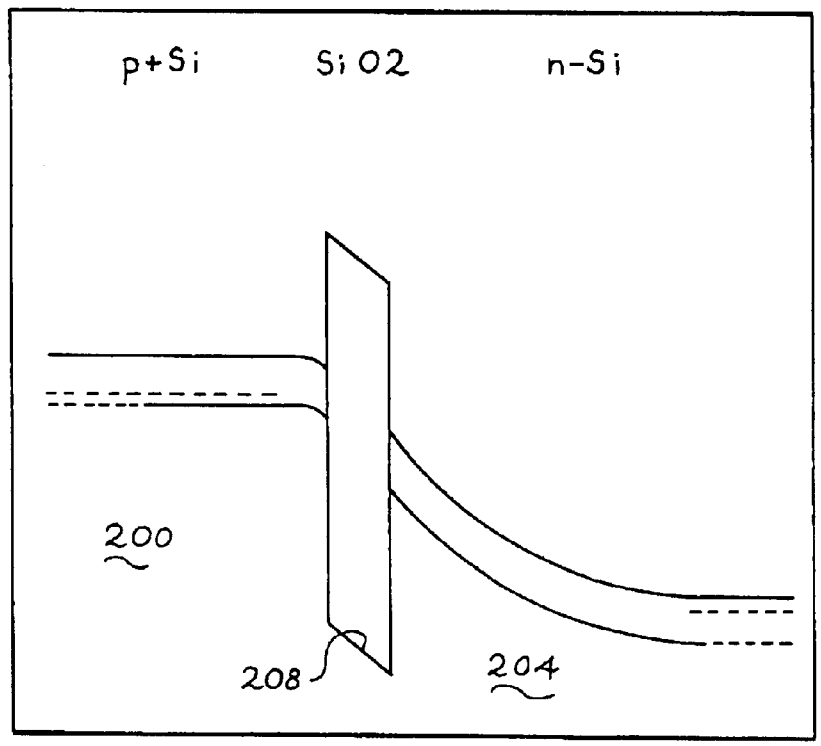

FIGS. 8 and 9 are schematic representations of two memory cells including dielectric rupture anti-fuse layers. The memory cell of FIG. 8 includes a low-leakage anti-fuse layer, and the memory cell of FIG. 9 includes a high-leakage anti-fuse layer.

In FIGS. 8 and 9, the reference symbols 200 and 204 are used to designate p+ poly silicon regions and n– poly silicon regions, respectively. The regions 200, 204 can be taken as examples of diode components. In the memory cell of FIG. 8, the regions 200, 204 form interface layers in direct contact with respective sides of a dielectric layer 202. In this example, the dielectric layer 202 is formed of silicon dioxide, and it has a relatively great thickness (greater than 35 Å) and a relatively low leakage current density in the unruptured state (less than 1 milliamps per square centimeter at 2 V).

FIG. 8 shows the memory cell with the p+/n– semiconductor regions reversed biased. In this situation, a high electric field is created across the anti-fuse layer 202, because holes accumulate in an inversion layer 206 on the n− side of the anti-fuse layer 202. These holes cannot be removed by an electron current from the p+ side, and they cannot escape through the anti-fuse layer 202 to the p+ side, since the leakage current through the anti-fuse layer 202 is low.

FIG. 9 shows a closely related memory cell, but in this case the anti-fuse layer 208 is characterized by a high leakage current density prior to anti-fuse rupture. In this situation, there is a lower electric field across the anti-fuse layer 208, because the leakage current through the unruptured anti-fuse layer 208 is large enough to prevent the buildup of a substantial inversion layer on the n− side of the anti-fuse layer 208.

The amount of charge that needs to be bled off through the anti-fuse layer (and therefore the preferred current leakage density of the unruptured anti-fuse layer) depends upon the amount of carrier generation that occurs in the depletion region of the n− layer 204. In the preferred embodiments described below, the regions 200, 204 are formed of doped poly silicon, which is typically characterized by a large amount of carrier generation in the depletion region of the n− layer. For this reason, the preferred anti-fuse layer is characterized by a matching large leakage current.

Figure 10:
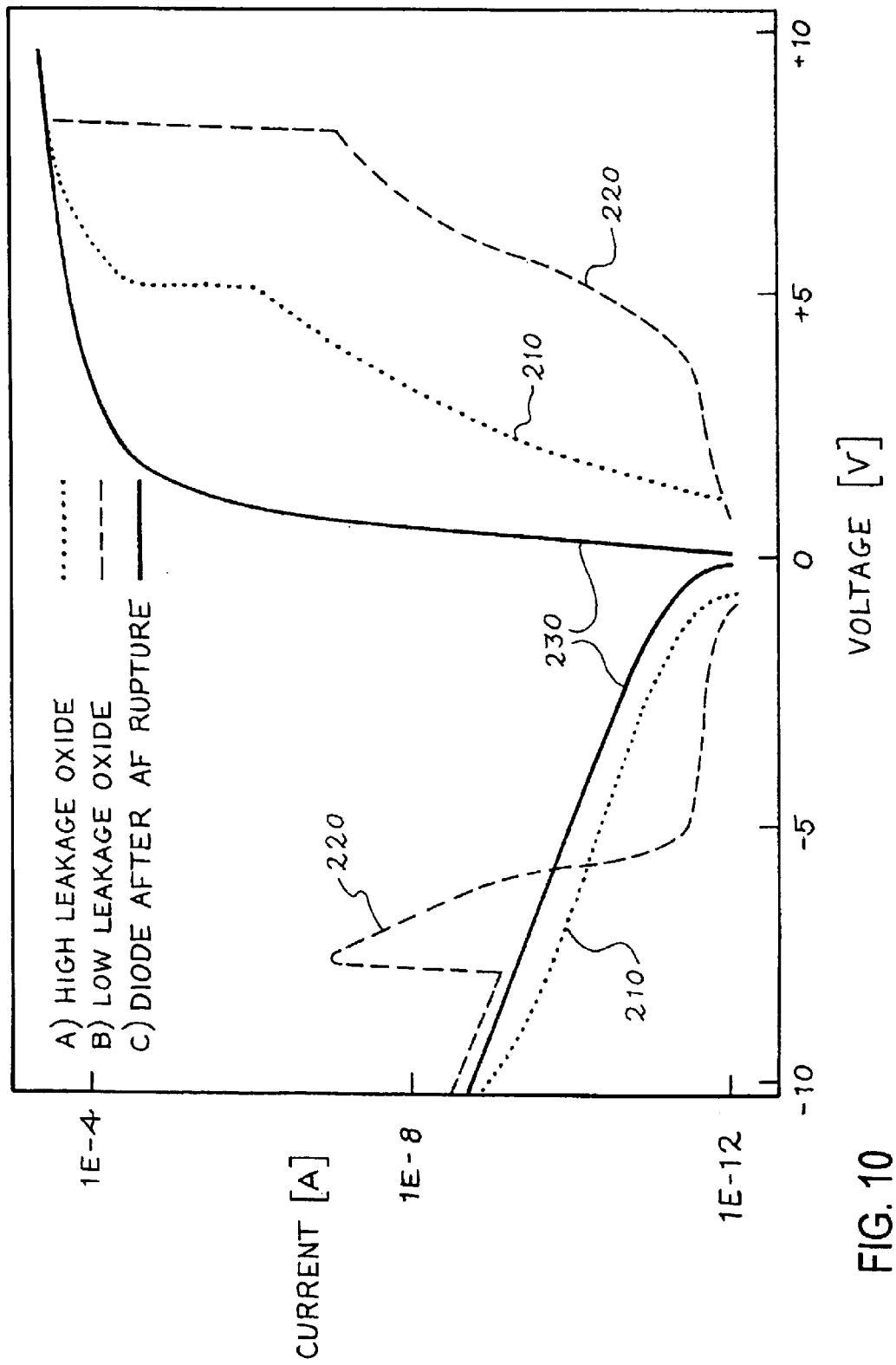
FIG. 10 is a graph of current versus voltage for three different memory cells.

FIG. 10 shows current versus voltage curves for both forward-biased and reverse-biased memory cells of the types discussed above in conjunction with FIGS. 8 and 9, where the anti-fuse layer is intact at the start of the measurement. In particular, the dotted line curve 210 was measured with the memory cell of FIG. 9, characterized by a high leakage current anti-fuse layer 208 prior to anti-fuse layer rupture, and the dashed line curve 220 was measured using the memory cell of FIG. 8, characterized by a low leakage anti-fuse layer 202 (again prior to anti-fuse layer rupture). The solid curve 230 of FIG. 10 represents a memory cell of the type shown in either FIG. 8 or FIG. 9 subsequent to anti-fuse layer rupture.

The curve 210 for the high leakage anti-fuse layer shows that it breaks down or ruptures at about 5 V in forward bias and that it does not breakdown or rupture for voltages as large as −10 V in reverse bias. In contrast, the low-leakage memory cell shown in curve 220 breaks down at about 8 V in both the forward-bias and the reverse-bias direction. For the memory cell with the low-leakage anti-fuse layer (curve 220), the current drops when the anti-fuse layer ruptures in reverse bias. The anti-fuse rupture is caused by the formation of a substantial inversion layer on the n− side of the anti-fuse layer, as discussed above. This substantial inversion layer produces a high electric field across the anti-fuse layer and results in a large tunneling current. The result can be inadvertently programmed cells or unprogrammed cells with poor lifetime during read operations. The tunneling electrons from the p+ side do not effectively recombine with the holes in the inversion layer on the n− side, but are swept away to the positive terminal (n−). When the anti-fuse layer ruptures or breaks, the inversion layer charge is removed, and the current drops to a level that is typical of a programmed cell.

The anti-fuse leakage current described above is the combined current associated with direct Fowler-Nordheim and modified Fowler-Nordheim tunneling, Poole-Frenkel conduction, and other mechanisms.

The leakage current for any given anti-fuse layer can be increased by reducing the thickness of the anti-fuse layer, or by changing the composition of the anti-fuse material or the interface layers on either side of the anti-fuse layer. The preferred embodiments described below employ thin oxide layers for the anti-fuse layer and oxide-based materials with high leakage currents. For selected embodiments, the anti-fuse layers are preferably thinner than 35 Å, more preferably thinner than 30 Å, and most preferably thinner than 20 Å. These thicknesses have been found suitable when silicon dioxide is used for the anti-fuse layer and poly silicon is used for the diode components 200, 204. Preferably, these anti-fuse layers have a leakage current density greater than 1 mA/cm$^2$ at 2 V, more preferably greater than 10 mA/cm$^2$ at 2 V, and most preferably greater than 100 mA/cm$^2$ at 2 V. These specific values for thickness and leakage current density are preferred for one type of memory cell. Other values of these parameters may be used for other types of diode components, as long as the conductivity of the unruptured anti-fuse layer is not substantially less than the conductivity of the reverse-biased diode components.

Figure 11:
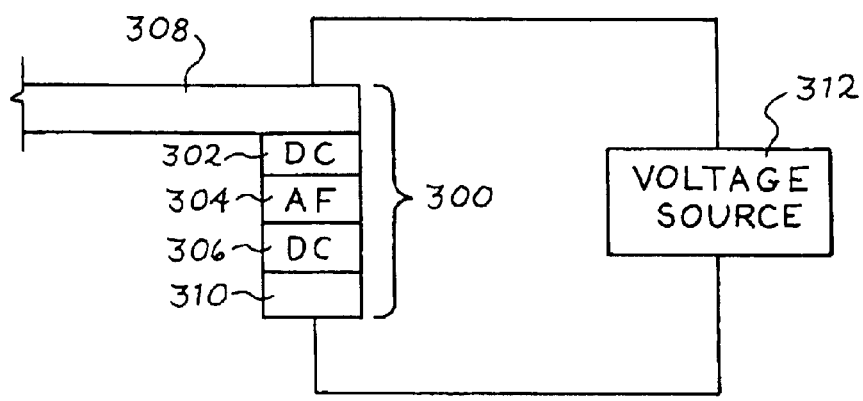
FIG. 11 is a schematic representation of another memory cell coupled to a voltage source.
Figure 12:
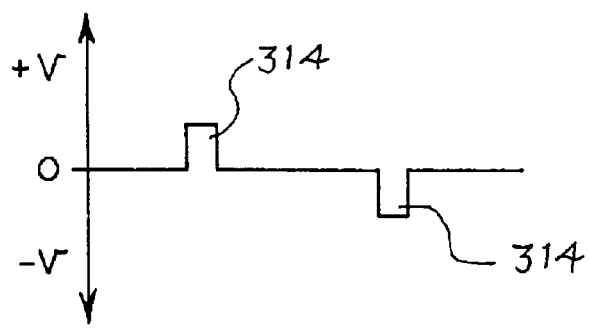
FIG. 12 is a graph illustrating a write pulse generated by the voltage source of FIG. 11.
Figure 13:
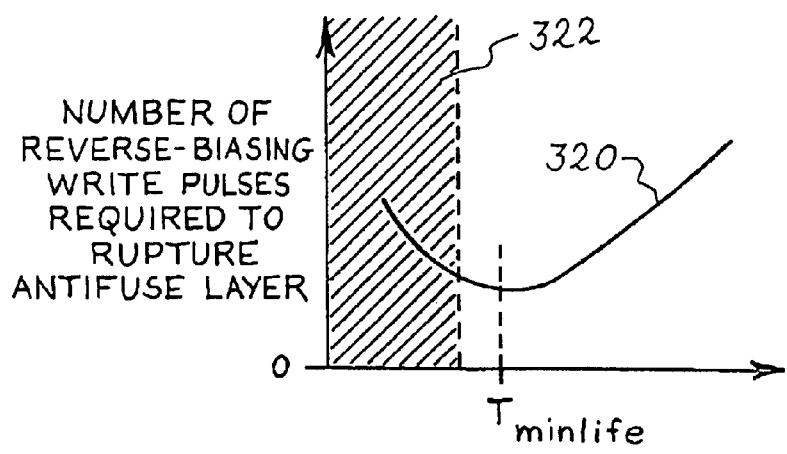
FIG. 13 is a graph of antifuse life as a function of antifuse thickness in the memory cell of FIG. 11.

FIGS. 11–13 relate to another three dimensional memory array made up of multiple two dimensional layers of memory cells vertically stacked one on top of another to form a three dimensional memory.

FIG. 11 shows a single memory cell 300 schematically. The memory cell 300 includes first and second diode components 302, 306 on respective opposite sides of an antifuse layer 304. The memory cell 300 also includes adjacent portions of conductors 308, 310.

The elements 302–310 can be constructed as described elsewhere in this specification. For example, the conductors 308, 310 can be formed of a suitable metallic film, the diode components 302, 306 can be formed of suitably doped semiconductor material, and the antifuse layer 304 can be formed to a suitable dielectric film Alternative embodiments of the memory cell 300 can place the diode components 302, 306 on the same side of the antifuse layer 304. In some cases the diode components 302, 306 may be formed as aligned portions of the conductors 308, 310, as for example when the conductors 308, 310 are formed of dopied semiconductor. In this alternative, the set of layers between the conductors 308, 310 can include only a single layer, the antifuse layer 304.

As shown FIG. 11 a voltage source 312 is coupled across the conductors 308, 310, and the voltage source 312 is operative to supply write pulses 314 (FIG. 12) to the conductors 308, 310. The write pulses 314 are supplied in two polarities, one of which forward biases the diode components 302, 306 and the other of which reverse biases the diode components 302, 306.

When a write pulse 314 is applied to the memory cell 300 with a polarity that forward biases the diode components 302, 306, the antifuse layer 304 is ruptured, thereby programming the memory cell 300. On the hand, when a write pulse 314 is applied across the memory cell 300 with a polarity that reverse biases the diode components 302,306, the antifuse layer 304 should remain intact. As described in U.S. Pat. No. 6,034,882, such reverse biasing write pulses are applied to non-selected memory cells in one architecture for a three dimensional memory array.

The ability of the anti-fuse layer 304 to survive multiple reverse biasing write pulses 314 is a function of the thickness T of the antifuse layer 304. FIG. 13 provides a graph in which the thickness of the antifuse layer 304 is plotted on the X axis and the number of reverse biasing write pulses required to rupture the antifuse layer is plotted on the Y axis. The present inventors have discovered that the curve 320 (that plots the number of reverse biasing write pulses required to rupture an antifuse layer as a function of the thickness of the antifuse layer) reaches a minimum for a selected $T_{minlife}$ of the antifuse layer. Because the curve 320 rises for values of the thickness T that are less than $T_{minlife}$, the present inventors prefer to use antifuse layers 304 having a thickness T less than $T_{minlife}$. For example, the antifuse layer 304 can be designed to have a thickness within the shaded region 322 of FIG. 13. In this way, the memory cell 300 is provided with an antifuse layer 304 that is unusually thin, but is unusually effective at withstanding reverse biasing write pulses.

One advantage to the use of thin antifuse layers is that they reduce the voltage required to rupture the antifuse layer for a forward biasing write pulse of a given duration. For example, in one embodiment the antifuse layer 304 is formed of silicon dioxide which, for a write pulse having a voltage of 8 volts has a value of $T_{minlife}$ equal to about 35 Å. Such antifuse layers are severely compromised by the currents generated during a nano ampere level of current stress when the diode components 302, 306 are reverse biased. In this example, the thickness T of the antifuse layer 304 is preferably less than 32 Å and more preferably about 28–30 Å. Such antifuse layers can survive more than ten times the current flux which damages a silicon dioxide antifuse layer of thickness 35 Å, without unacceptable damage.

Also, the use of thinner antifuse layers allows for more tolerance on the performance of the series connected diode components. Typical deposited diode components leak enough during reverse biased conditions that a silicon dioxide antifuse layer is preferably below 30 Å, in thickness for good reliability.

Though the foregoing discussion has mentioned silicon dioxide antifuse materials, other antifuse materials can be used, and each will have a different value for $T_{minlife}$. Without intending to be bound by any theory of operation, the present inventors believe that the advantages described above are obtained when the antifuse layer is thin enough to allow moderate voltage electrons to tunnel through the antifuse layer, with a large fraction of the tunneling electrons passing through the antifuse layer without hitting a silicon or oxygen atom. It is believed that when antifuse layer is thin enough holes also tunnel through the antifuse layer, thereby preventing a large electrical field from being generated across the antifuse layer. Single crystal diode components have sufficiently low leakage currents under reverse biased conditions that they can be used with thicker antifuse layers.

The presently preferred thickness for a silicon dioxide antifuse layer 304 is in the range of 28–30 Å. Such antifuse layers can be formed using the method described in the following section. As an alternative, the following methods may be substituted:

Thermal oxidation,
Rapid thermal oxidation,
Plasma oxidation,
High density plasma oxidation,
Chemical vapor deposition.

Rapid thermal oxidation is presently preferred, typically for doped polysilicon at a temperature between 700 and 800 deg C. for 60 sec or less in the presence of either $O_2$ or $O_2+N_2$.

Though silicon dioxide is described in detail below as one example of a suitable anti-fuse layer material, other materials can be used, such as silicon nitride, silicon carbide, amorphous carbon, amorphous silicon, metal oxides, other oxides, and other dielectric materials.

In the examples of FIGS. 8, 9, and 11, the diode components 200, 204 are positioned on opposite sides of the anti-fuse layers 202, 206. However, this is not required in all cases. In general, the diode components are coupled in series with the anti-fuse layer, but both diode components may be positioned on the same side of the anti-fuse layer. Also, the anti-fuse layer may be positioned between more heavily doped regions and less heavily doped regions of the same doping polarity, e.g. p+/AF/p−/n+. A wide variety of diode components can be used, including both p+n and n+p. In this specification and the following claims, the term "diode component" is intended broadly to mean a component of a diode (when the two diode components are immediately adjacent one another) or a component of a diode that is formed only after one or more intermediate layers have been ruptured (as for example where the anti-fuse layer is positioned between the diode components). As explained above, in order to reduce the unintended rupture of the anti-fuse layer, it is preferred in some environments to match the conductivity of the anti-fuse layer with the conductivity of the diode components when reverse biased. In general, when this approach is used, the conductivity of the anti-fuse layer should preferably be greater than about 25% of the conductivity of the diode components when reverse biased, more preferably greater than about 50% of the conductivity of the diode components when reverse biased, and most preferably greater than 100% of the conductivity of the diode components when reverse biased.

The specific geometry of the layers that form the memory cells can vary widely, and can include a pillar construction such as that shown in U.S. Pat. No. 6,034,882, assigned to the assignee of the present invention and hereby incorporated by reference, or a rail stack structure such as that described in detail in the following examples.

Though the following examples describe the use of plasma techniques for forming the anti-fuse layer, this should be taken as only one example. Many other approaches may be used for forming anti-fuse layers with the characteristics described herein. For example, various oxidation techniques can be used. In one specific example, a doped silicon surface is oxidized at a temperature of 800° C. for one minute in an atmosphere of dry $O_2$ to produce an anti-fuse layer of the type described herein.

EXAMPLES

In the following examples, an improved dielectric anti-fuse layer having a uniform thickness is fabricated for use in a semiconductor memory device. The formation of a dielectric layer having a precisely determined thickness can improve the function of a semiconductor device by, for example, improving the reproducibility of the fabrication process.

In the following examples, a silicon oxide anti-fuse layer is grown on the upper surface of a semiconductor layer at a precisely controlled oxidation rate. Control of the oxidation rate enables the oxide layer to be formed to a predetermined thickness, which can be on the order of only tens of angstroms. The oxidation rate control is provided by one or more methods to regulate the plasma activity at the surface of the semiconductor layer. The methods include both surface conditioning prior to presenting an oxidizable surface to the oxidizing plasma, adjustment of plasma gases and operating conditions before or during plasma oxidation, or both.

Although the following examples will be described in the context of the formation of an oxide layer on a silicon surface, the process can be applied to any oxidizable surface.

To condition the oxidizable surface prior to oxide growth, the oxidizable surface can be bombarded with energetic ions. The energetic ions can be generated in a plasma within a High Density Plasma (HDP) system and accelerated toward the oxidizable surface. The energetic ions can be any species capable of creating a sputtering action at the oxidizable surface. For example, the energetic ions can be relatively heavy inert ions, such as noble gas ions. Noble gas ions such as argon are substantially unreactive with the oxidizable surface, yet are energetic enough to condition the oxidizable surface. Alternatively, lighter inert gas ions, such as helium can also be used. In yet another alternative, combinations of noble gas ions such as Ar mixed with He can be used.

The ion bombardment process can remove any native oxides from the surface of the semiconductor layer. Further, the ion bombardment process can be carried out to facet or otherwise alter the topography of the surface of the semiconductor layer. By bombarding the surface, the reaction rate of oxidizing species with silicon atoms at the surface can be enhanced. In the instance where a dielectric rupture anti-fuse is formed, bombarding also enables the formation of an anti-fuse layer having highly reproducible rupture characteristics.

A precisely controlled oxidation rate can be attained by adjusting the composition of an oxidizing plasma. For example, in addition to oxygen, substantial amounts of an inert gas, such as argon, helium, neon, xenon and the like, can be used to form the plasma. By diluting the plasma with an inert gas, fewer activated oxygen species are available at the oxidizable surface to react with silicon. By effectively starving the oxidizable surface of oxygen, a low oxidation rate is realized. Although any inert gas can be used, argon is a preferred diluent gas. The concentration of the inert gas can be adjusted during the plasma oxidation process to control the growth rate of the oxide film. For example, holding all other operating parameters constant while increasing the inert gas concentration relative to that of an oxidizing species will reduce the growth rate of the oxide layer.

Oxidizing plasma conditions are preferably employed such that the growth of the oxide layer is self-limited to a predetermined thickness. To form silicon oxide, an oxidizing species of the plasma must diffuse from the plasma to the surface of silicon layer. At the surface, the oxidizing species reacts with silicon atoms to form a silicon oxide layer. By adjusting the operating parameters of the plasma system, the growth rate of the oxide layer can be made dependent upon the diffusion rate of the oxidizing species through the oxide layers previously formed on the surface of semiconductor layer 15.

Early in the oxidation process, the growth of the oxide layer is reaction rate limited, such that the growth rate is determined by the reaction rate of oxidizing species with silicon at the surface of the semiconductor layer. However, as the thickness of the oxide layer increases it takes progressively longer for the oxidizing species to diffuse through the oxide layer to reach the silicon surface. At some point, the diffusion of oxidizing species through the oxide layer becomes so slow that the growth of new oxide effectively ceases. Thus, the thickness of the oxide layer can be controlled through a self-limiting mechanism.

It is a particular advantage that additional exposure to the oxidizing plasma beyond some initial exposure time will not result in a significant further increase in oxide thickness. By creating a self-limiting oxide growth mechanism the oxide layer thickness can be made consistent from one substrate to the next. Also, the plasma oxidation process will not require excessive monitoring to insure that a precisely determined oxide thickness is obtained.

One means of establishing a self-limiting mechanism is by controlling the temperature of the oxidizable surface. High density plasma oxidation is a relatively low temperature oxidation process. The temperature of the oxidizable surface can be further reduced, or regulated, by contacting the substrate with a cooling medium. The rate of cooling of the substrate can be adjusted relative to the power levels of the plasma to effectively control the oxidation rate at the oxidizable surface.

Additional control over the diffusion of oxidizing species can be obtained by controlling the energy of the plasma by adjusting the RF power level and bias power of the plasma system. In general, the more energetic oxidizing species will diffuse faster through the oxide layer and react more rapidly with the oxidizable surface. The energy level of the activated oxidizing species in the plasma can be further controlled by the application of a bias voltage to the substrate. A high bias voltage will accelerate ions in the plasma across the space charge region and impart high energy into the substrate and the growing oxide layer. High bias power also heats the substrate surface resulting in the enhanced diffusion of uncharged species and high growth rate.

Excessive bias power will result in the sputtering of the dielectric material through bombardment by energetic ions from the plasma. This aspect of the process can be advantageously used to form a dielectric layer having a precisely determined thickness. For example, the sputter removal rate can be balanced with the oxidation growth rate to modulate the total dielectric film formation rate on the semiconductor substrate. This technique represents yet another aspect of providing a self-limiting oxidation process.

In addition to the foregoing, adjusting the concentration of oxidizing species relative to inert species in the plasma will affect the flux of activated oxidizing species through the oxide layer. Inert gas dilution levels in the plasma can be adjusted to limit the amount of oxidizing species that arrives at the surface of the oxide layer.

In the following description, the advantages of the inventive process will be described in the context of the fabrication of a vertically-stacked, field programmable, non-volatile memory device.

Figure 1:
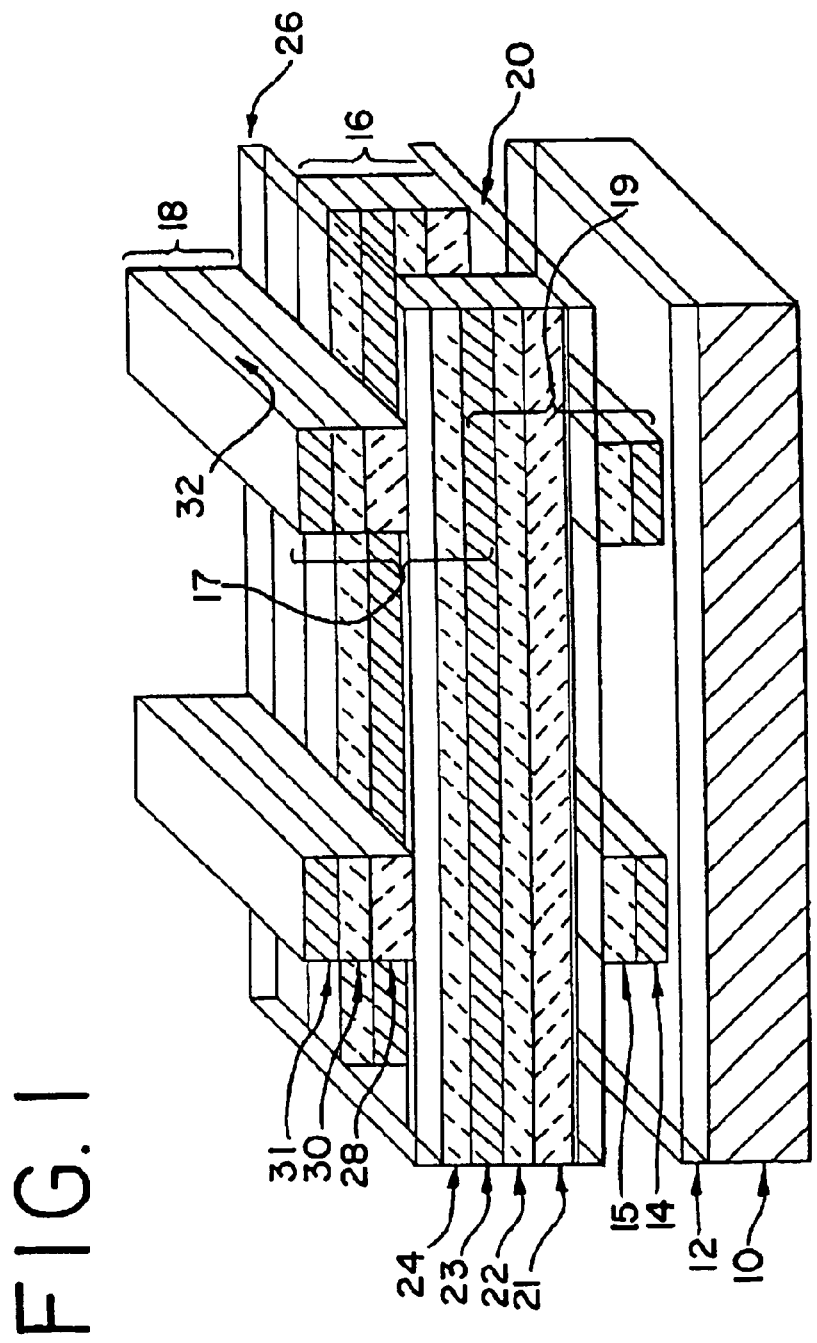
FIG. 1 illustrates a perspective view of a cut-away portion of a memory array including a dielectric anti-fuse.

One example of a vertically-stacked, field-programmable, non-volatile memory device fabricated in accordance with the present invention is illustrated in FIG. 1. A perspective view of several rail-stacks of a three-dimensional memory array is illustrated in partial cross-section. The array is fabricated on a substrate 10 which may be an ordinary monocrystalline silicon substrate. Decoding circuitry, sensing circuits, and programming circuits are fabricated in one embodiment within the substrate 10 under the memory array using, for instance, MOS fabrication techniques to fabricate MOS transistors and the like. (These, circuits may also be fabricated above the substrate.) Vias are used to connect conductors within the rail-stacks to the substrate to allow access to each rail-stack in order to program data into the array and to read data from the array. For instance, the circuitry within the substrate 10 may select rail-stack 16 and the rail-stack 18 in order to either program or read a bit associated with the intersection of these rail-stacks.

Once the underlying circuitry is formed, the data storage components of the memory device are fabricated above the circuitry. The memory array illustrated in FIG. 1 is fabricated on several levels and, for instance, may have eight levels of storage. Each level includes partially or completely a first plurality of parallel spaced-apart rail-stacks running in a first direction and a second plurality of rail-stacks or conductors (depending on the embodiment) running in a second direction. A rail-stack may be shared by two levels of storage. Generally, the first rail-stacks run perpendicular to the second conductors/rail-stacks and hence form a right angle at their intersections.

In the array illustrated in FIG. 1, several rail-stacks are shown in partial cross-section. For instance, rail-stack 16 is shown at one height and a half rail-stack 18 is shown at a second height above the first height. Also, half rail-stacks are disposed between rail-stack 16 and a substrate 10. These lower half rail-stacks run in the same direction as the half rail-stack 18. A bit is stored at the intersection of rail-stacks and, for instance, a "cell" is present between the rail-stacks and layers shown within the bracket 17 and another cell is within the bracket 19. Each of these brackets spans a memory level.

As shown in FIG. 1, an insulating layer 12 is formed over the substrate in order that the array may be fabricated above the substrate. This layer may be planarized with, for instance, chemical-mechanical polishing (CMP) to provide a flat surface upon which the array may be fabricated.

After planarizing insulating layer 12, a conductive layer 14 is formed on the substrate. As will be seen, conductive layers are used within the rail-stacks and these layers and the resultant conductors may be fabricated from elemental metals, such as tungsten, tantalum, aluminum, copper or metal alloys may be used such as MoW. Metal silicides may also be used such as $TiSi_2$, $CoSi_2$ or a conductive compound, such as TiN, WC and the like may be used. A highly doped semiconductor layer such as silicon is also suitable. Multiple layer structures may be used selecting one or more of the above.

Following the deposition of the conductive layer, a semiconductor material layer 15, such as silicon, is formed over the conductive layer. This is typically a poly silicon layer; however, an amorphous layer may be used. Other semiconductor materials may also be used, such as Ge, GaAs, and the like. In the array illustrated in FIG. 1, semiconductor layer 15 is highly doped and, as will be seen, forms one half a diode. After masking and etching steps, half rail-stacks are formed. These rail-stacks are "half" or partial rail-stacks since they are approximately half the thickness of the rail-stacks used in subsequent levels. A dielectric layer (not shown) is deposited to fill the area between the rail stacks.

Once semiconductor layer 15 is formed, a plasma oxidation process is carried out to form an anti-fuse layer 20 of the type describe above. A plasma oxidation process can grow a high-purity and uniformly thick oxide layer that is of the thickness and is characterized by the leakage current described above. Optimal quality is easier to achieve when the surface upon which the oxide layer is to be grown is substantially free of particulate matter. Accordingly, in a preferred embodiment, the upper surface of semiconductor layer 15 is processed to remove contaminants prior to performing the plasma oxidation process. To prepare the surface of semiconductor layer 15, a CMP process is carried out to form a substantially uniform surface topography and to expose the upper surface of layer 15. Then, a brief chemical etching process is performed to remove any polishing debris from the surface. In one method, a wet chemical hydrofluoric acid (HF) dip is used to clean the surface.

Once the formation of an anti-fuse layer 20 is complete, the process continues with the formation of a full set of memory array rail-stacks on anti-fuse layer 20. This comprises first the deposition of a lightly doped silicon layer 21 doped with a conductivity type dopant opposite to that used for the silicon layer 15, a heavily doped silicon layer 22 doped also opposite to the layer 15, a conductive layer 23 and a heavily doped silicon layer 24 doped with the same conductivity type dopant as layers 21 and 22.

The section of the non-volatile memory device illustrated in FIG. 1 that includes silicon layer 15, anti-fuse layer 20 and silicon layer 21 forms a dielectric rupture element. When a voltage potential is applied of sufficient magnitude, anti-fuse layer 20 will breakdown and a current will flow from silicon layer 15 to silicon layer 21. Numerous dielectric rupture elements are fabricated in the non-volatile memory devices described herein. Although, presently illustrated in the context of a silicon device having rail-stacks, the dielectric rupture element can be used in a number of different memory structures and can be formed by other semiconductor layers, such as germanium and the like.

After masking and etching, the rail-stacks shown in FIG. 1, such as rail-stack 16, are formed. These rail-stacks are, as illustrated, in a direction perpendicular to the rail-stacks above and below them. While not shown in FIG. 1 but as will be described later, the spaces between the rail-stacks after they are defined, are filled with a dielectric such as silicon dioxide. Then the rail-stacks and fill are planarized by CMP. In another embodiment spin-on-glass (SOG) is used to fill the voids. In this case chemical planarization can be used such as, for example, plasma etching. Other fill and planarization methods can also be used.

After formation of the rail-stacks another anti-fuse layer 26 is formed. The high-density plasma oxidation process described above is used to form anti-fuse layer 26 with the thickness and leakage current characteristics described above.

Now another layer of rail-stacks is defined and only half rail-stacks are shown in FIG. 1 at this upper level. This half rail-stack comprises a silicon layer 28 doped with a conductivity type dopant opposite to that of silicon layer 24. This is a lightly doped layer. Another silicon layer 30 is formed on silicon layer 28 and doped with the same conductivity type dopant as silicon layer 28. However, silicon layer 30 is more heavily doped than silicon layer 28. Then, a conductive layer 31 is formed on silicon layer 30.

Half rail-stacks are used at the very upper-most level of the array and at the very lowest level of the array. In between the half rail-stacks a number of full rail-stacks, such as rail-stack 16, are used throughout the array.

It should be noted that the silicon layers disposed on the conductive layers extend the entire length of the rail-stacks in the embodiment of FIG. 1 and are uninterrupted except possibly where vias are used to provide a conductive path to substrate 10.

The dielectric anti-fuse layers are preferably grown using a high-density-plasma (HDP) technique. Several existing plasma systems have the capability of generating an HDP, including systems such as an "Ultima Centura" from Applied Materials, Inc. (Santa Clara, Calif.), a "Speed" from Novellus Corp (San Jose, Calif.) and the like. A distinct advantage of the HDP technique is that the plasma oxidation process can be carried out at relatively low temperatures. Low temperature processing avoids the unwanted diffusion of dopants already present in the substrate and the premature recrystallization of semiconductor materials. A further advantage of the HDP technique is the ability to control the thickness and uniformity of the oxide layer compared with conventional oxidation techniques. Uncontrolled growth can be prevented by avoiding inadvertent exposure of the oxidizable surface to an oxidizing plasma during substrate loading operations.

Figure 2:
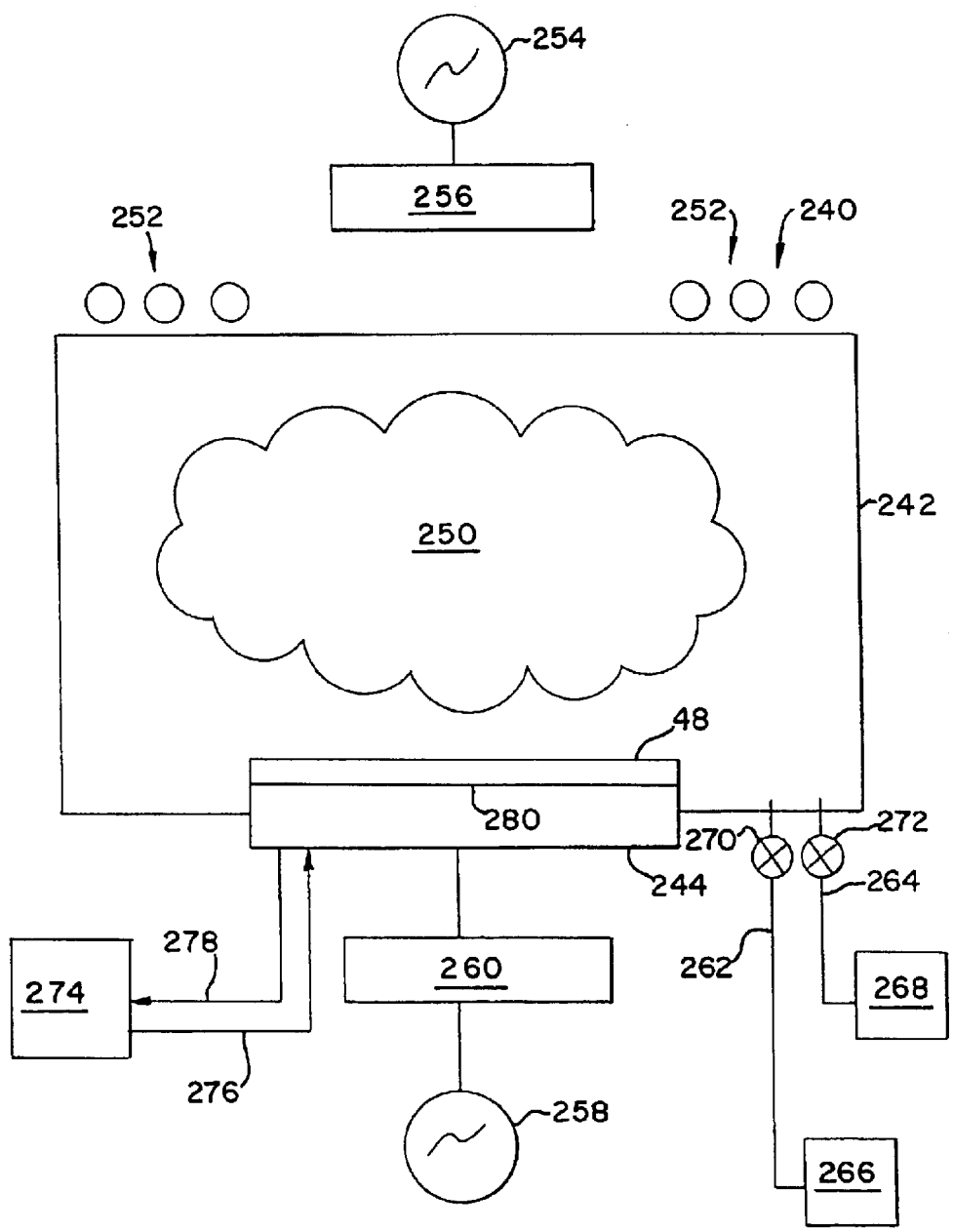
FIG. 2 is a schematic diagram of a high density plasma oxidation system.

A schematic diagram of an exemplary HDP system 240 is illustrated in FIG. 2. HDP system 240 includes a plasma chamber 242 in which a substrate platen 244 is positioned. A substrate 248 resides on platen 244 and is subjected to energetic oxidizing species from a plasma 250 created within plasma chamber 242. Inductive coils 252 are disposed about a portion of plasma chamber 242. An RF power supply 254 inductively couples RF energy to plasma 250 through a matching network 256 and inductive coils 252.

Platen 244 is independently coupled to an RF power supply 258 through a matching network 260. Accordingly, an RF bias can be applied to substrate 248 independent of the RF power applied to plasma 250.

Plasma chamber 242 is plumbed with gas lines 262 and 264 that couple gas supplies 266 and 268, respectively, to plasma chamber 242. In the exemplary HDP system illustrated in FIG. 2, gas supply 266 contains sources of oxidizing gases and gas supply 268 contains sources of inert gases. Mass flow controllers 270 and 272 regulate the flow of gas through gas lines 262 and 264 from gas supplies 266 and 268, respectively. Accordingly, the flow of oxidizing gas species and inert gas species into plasma chamber 242 can be independently controlled. Alternatively, the oxidizing gas can be pre-mixed with the inert gas and be supplied from a common gas supply.

A cooling medium can be circulated through platen 244 by supplying a cooling medium from a cooling supply 274 through recirculation lines 276 and 278. Any of a number of cooling media can be used to cool platen 244, including helium and gas or liquid refrigerants and the like. The temperature of substrate 248 can be controlled by conductive heat transfer though a back side 280 of substrate 248. To facilitate heat transfer from substrate 248, platen 244 includes an electrostatic substrate clamping mechanism to tightly hold substrate 248 against the platen. Additionally, helium or other gas can be introduced between the platen and the wafer to further enhance heat transfer between the platen and the wafer. The pressure of the gas can also be modulated to control the rate of heat transfer.

In addition to the features illustrated in FIG. 2, exemplary HDP system 240 can also include plasma focusing subsystems to increase the density of plasma 250.

In a preferred embodiment, an inert gas plasma is ignited in plasma chamber 242 and substrate 248 is placed in plasma chamber 242. The inert gas plasma is preferably a plasma formed by a mixture of argon and helium. Alternatively, the inert gas plasma can be either argon or helium or other noble gases. Then, RF bias power is applied from RF power supply 258 and the surface of substrate 248 is bombarded with energetic species from the argon/helium/noble gas plasma. As described above, the bombardment process sputters away residual oxide layers and debris from the surface of semiconductor layers present on the surface of substrate 248. Furthermore, the bombardment process facets the semiconductor surfaces in preparation for plasma oxidation.

A wide variety of power levels can be applied depending upon several factors, including the particular material structure to be oxidized, the desired energy level of bombarding species and the like. For example, where the semiconductor material is silicon, in the exemplary HDP system shown in FIG. 2, an RF bias power of preferably about 800 W to about 1200 W and, more preferably, about 1000 W is applied. The bombardment process is carried out for preferably about 8 to about 12 seconds and, more preferably, for about 10 seconds.

After the initial sputtering process is complete, oxidizing gases are introduced into plasma chamber 242 to form an oxidizing plasma. An oxidizing plasma can be formed using a number of oxidizing species, such as oxygen, ozone, nitrous oxide and the like. Further, the oxidizing species can be mixed with inert gases, such as argon, helium and the like.

In a preferred embodiment, an oxidizing plasma is formed using a mixture of oxygen and argon gas. The oxide growth rate can be regulated by diluting the oxygen concentration. Preferably, mass flow controllers 270 and 272 are activated and a relatively high dilution ratio is obtained by flowing about 40 to about 60 standard-cubic-centimeters-per-minute (sccm) of oxygen and, more preferably, about 50 sccm of oxygen, and about 400 to about 600 sccm of argon and, more preferably, about 500 sccm of argon into plasma chamber 242. The dilution ratio of oxygen to diluent gas will vary depending upon the chamber geometry, the operating parameters of the particular HDP system, and the like.

The dilute plasma is energized by applying RF power from RF power supply 254 using a power level of preferably about 1500 W to about 2500 W and, more preferably, about 2000 W. In the preferred oxidation process, no RF bias power is applied during the oxide growth phase. However, a small amount of RF bias power can be applied as necessary to further reduce the oxide growth rate. Further, as described above, additional plasma focusing methods, such as magnetic energy, can be applied during the oxide growth phase to control the oxide growth rate. To cool substrate 248 during oxidation, a helium gas pressure of preferably about 6 to about 10 torr and, more preferably, about 8 torr is provided between the wafer and the platen to enhance heat transfer.

A dielectric film having an oxynitride composition can be formed by introducing nitrogen or a nitrogen-containing compound during the oxidation process. For example, about 10 sccm to about 200 sccm of nitrogen can be fed into plasma chamber 242 from gas supply 268. Alternatively, a nitrogen-containing compound such as ammonia ($NH_3$), nitrous oxide ($N_2O$) and the like can also be used.

The oxynitride process can also be used to form an oxynitride region at the surface of a previously-grown silicon oxide layer. For example, the plasma process described above can also be carried out to nitridize a previously-grown silicon oxide surface. In this case, rather than form a uniform oxynitride layer having a uniform composition, nitrogen is introduced into the upper surface of the silicon oxide layer to form an oxynitride region at the silicon oxide surface.

In a further embodiment, a layer of silicon nitride can be formed over a silicon oxide layer. In this process, once the silicon oxide layer is formed, process gases are introduced into plasma chamber 242 to form a silicon nitride layer. For example, a silicon nitride layer can be formed by introducing silane or dichlorosilane and ammonia or nitrogen to form a plasma deposited layer of silicon nitride. Other silicon nitride forming process are possible, such as chemical-vapor-deposition (CVD) and the like. Accordingly, other types of silicon nitride forming processes can be used.

In an alternative embodiment, a pre-oxidation step using a nitrogen plasma can be carried out before growing a silicon oxide or oxynitride layer. For example, the substrate can be subjected to a plasma preconditioning step using nitrogen or nitrous oxide, or the like for a brief period prior to commencing the dielectric growth process.

In yet another embodiment, the dielectric layer is formed to include other elements, such as carbon. The inclusion of carbon in the dielectric film can be accomplished by, for example, introducing methane (CH$_4$) or other hydrocarbon gas into plasma chamber 242 during the oxidation process. For example, about 10 sccm to about 200 sccm of methane can be introduced during the oxidation process.

Figure 3:
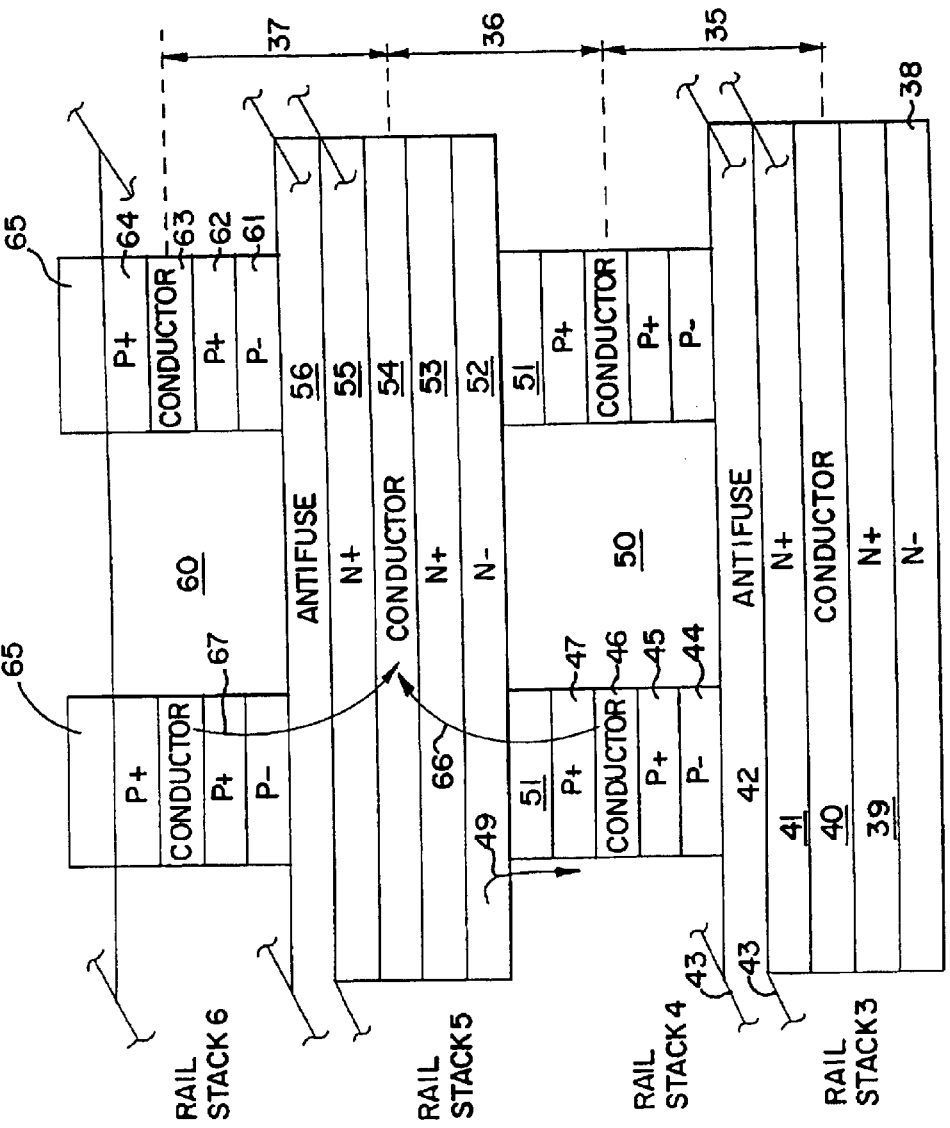
FIG. 3 illustrates a cross-sectional elevation view of a memory array.

In the cross-sectional view of FIG. 3, one embodiment of a memory device is illustrated that corresponds to the embodiment shown in FIG. 1. In FIG. 3, the half railstacks of FIG. 1 are not illustrated. Instead, three complete cells 35, 36 and 37 of the array are illustrated in FIG. 3. The three cells are located between a lower silicon layer 38 and an upper anti-fuse layer 65. Although not illustrated in FIG. 3, other rail-stacks or half rail-stack can be formed below silicon layer 38 of FIG. 3. Also, full or half rail-stack can be formed above anti-fuse layer 65.

The rail-stack 3 comprising layers 38 through 41 include a lightly doped n− semiconductor layer 38, a heavily doped n+ semiconductor layer 39, a conductor layer 40 and an n+ semiconductor layer 41. The fabrication of these rail-stacks will be discussed in more detail in conjunction with FIG. 4A through FIG. 4G. An anti-fuse layer 42 covers all of the rail-stacks formed below layer 42. Anti-fuse layer 42 is formed using the HDP oxidation process described above with a thickness of 25 Å and a leakage current density (prior to anti-fuse rupture) of 400 mA/cm$^2$ at 2V. An additional dielectric layer is deposited to fill the voids between the rails.

It should be noted that n+semiconductor layers sandwich conductor layer 40. These highly doped layers provide ohmic transitions to prevent unintended Schottky diode formation. The layers above and below conductor 40 are not symmetrical for the embodiment illustrated in that n− semiconductor layer 38 is used below conductor layer 40 and not above conductor layer 40. Only a single lightly doped layer (in conjunction with a heavily doped layer) is needed to define a diode; the thickness of this lightly doped layer is important in controlling the break-down voltage and resistance of the diode so formed. Semiconductor layer 41 and the dielectric fill layer are planarized after the rail-stacks are defined and then an HDP oxidation process is carried out to form an anti-fuse layer 42 semiconductor layer 41. As previously described, a wet chemical etch can also be carried out to clean the surface of semiconductor layer 41 prior to the HDP oxidation process. (The lines 43 in FIG. 3 are used to indicate that anti-fuse layer 42 and like layers are not etched with the rail-stack below it and thus extend over the entire surface of the underlying semiconductor layer in the illustrated embodiment.)

A rail-stack 4, comprising semiconductor layers 44, 45, conductor layer 46 and semiconductor layer 47, is formed on anti-fuse layer 42. In the embodiment illustrated in FIG. 3, semiconductor layer 44 is lightly doped with a p-type dopant and semiconductor layers 45 and 47 are more heavily doped with a p-type dopant. After these layers are deposited, they are masked and etched to define the rail-stacks. Then, the voids between these rail-stacks, such as void 50, are filled with a dielectric. The dielectric fill is planarized along with a portion of p+ semiconductor layer 47. Planarization is done at this point in the fabrication since there is generally poor control over the thickness and contour of the dielectric fill. The fill tends to build up on the rail-stacks when a non-spin-on type deposition is used. Anti-fuse layer 51 is formed using the HDP oxidation process described above.

The process is now repeated to form rail-stack 5, this time beginning with an n− semiconductor layer 52 followed by an n+ semiconductor layer 53, a conductive layer 54 and n+ semiconductor layer 55. Again after defining the rail-stacks 5, the voids are filled and the surface is planarized. Another anti-fuse layer 56 is formed using the HDP oxidation process described above.

The process is repeated for rail-stacks 6, this time beginning with a p− semiconductor layer 61, p+ semiconductor layer 62, conductive layer 63, p+ semiconductor layer 64. Again after defining the rail-stacks, filling the void 60 with a dielectric layer and then planarizing, another anti-fuse layer 65 is formed using the HDP oxidation process described above.

It should be noted that with the reversal of the p− and n− layers at each successive rail-stack, planarization for this embodiment always occurs on a heavily doped layer, such as semiconductor layer 47 and semiconductor layer 55. Moreover, the lightly doped layers are always formed on relatively planar surfaces, consequently their thickness can be more easily controlled. This, as mentioned, allows the characteristics of the diode (once the intermediate anti-fuse layer is breached) to be more reliably controlled.

The process flow for forming rail-stack 5 of FIG. 3 is illustrated in FIGS. 4A–4H. It will be apparent that the rail-stacks for the other embodiment (FIGS. 5 and 6) are similarly processed.

Figure 4A:
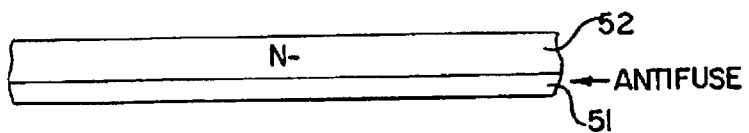
FIGS. 4A–4H illustrate, in cross-section, process steps for fabrication of the memory array illustrated in FIG. 3.

First, as shown in FIG. 4A an anti-fuse layer 51 is formed. Preferably, about 15 to 35 Å of silicon dioxide is formed by the HDP oxidation process described above. Although shown as a continuous layer, as previously described, the HDP process oxidizes only the silicon material of underlying p+ semiconductor layer 47. Following the formation of anti-fuse layer 51, semiconductor layer 52 is deposited, which is typically about 1000 to about 4000 Å thick and preferably formed by a CVD process. In the CVD process, a phosphorous dopant is deposited along with the deposition of for instance, the poly silicon semiconductor material. Alternatively, after carrying out the CVD process, dopant ions can be ion implanted into semiconductor silicon layer 52. Preferably, semiconductor layer 52 is doped to a level of, for example, about $1 \times 10^{17}$/cm$^3$, but can be doped to a level in a range from about $1 \times 10^{15}$/cm$^3$ to about $1 \times 10^{19}$/cm$^3$.

Figure 4B:
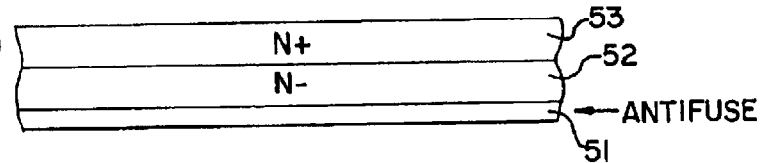

Now, as shown in FIG. 4B, n+ semiconductor layer 53 is deposited again using a CVD process. This layer may be approximately 300 to approximately 3000 Å thick, and, in one embodiment, is doped to a level of greater than about $10^{19}$/cm$^3$.

In accordance with the disclosed embodiment, two adjacent semiconductor layers are often shown with different doping levels, such as semiconductor layers 52 and 53. These layers may be formed with one deposition and using ion implantation steps at two different energy levels to obtain the desired two doping levels. Also, the variation in doping concentration of semiconductor layers 52 and 53 may be obtained by introducing different amounts of dopant in a diffusion process as a layer is formed.

Figure 4C:
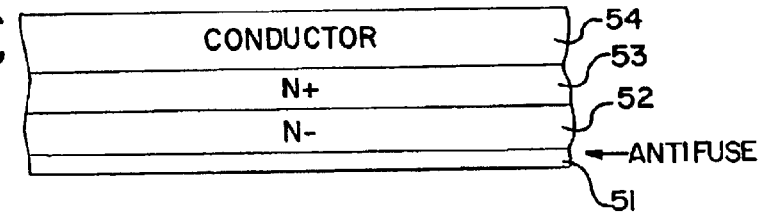

Referring to FIG. 4C, a conductive layer 54, which may be about 500 Å to about 1500 Å thick, is formed using any one of numerous well-known thin film deposition processes, such as sputtering and the like. The conductive layer can be a refractory metal or a refractory metal silicide. Also as mentioned aluminum or copper can be used, or more simply the heavily doped silicon can be the conductor. In one embodiment, Ti and TiN layers are formed on the silicon layer and the wafer is heated to form a silicide. For instance, a Ti layer of about 250 Å and a TiN layer of about 70 Å are heated at about 600° C. for about one minute to form the silicide.

Figure 4D:
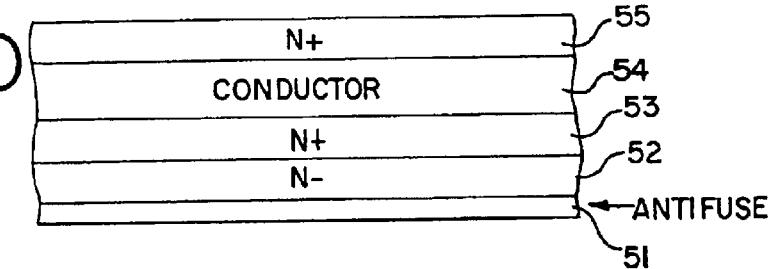

Next, as illustrated in FIG. 4D, another semiconductor layer 55 composed of, for instance, poly silicon approximately 1500 Å to approximately 2000 Å thick is formed and again doped to a level of greater than about $10^{19}/cm^3$. After the planarization process that is carried out to prepare semiconductor layer 55 for the subsequent HDP oxidation process, its thickness is reduced to about 300 Å to about 2000 Å.

Figure 4E:
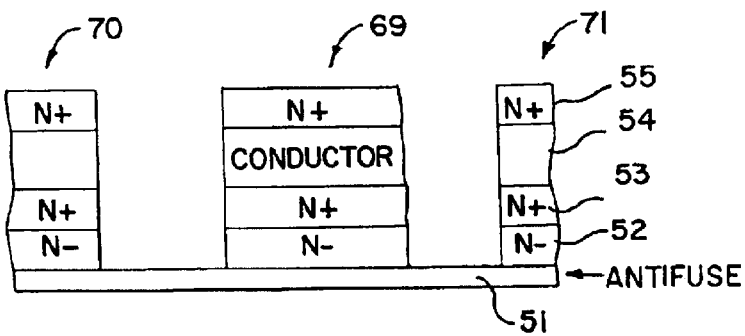

A masking and etching step is now used to define rail-stacks, such as rail-stacks 69, 70 and 71 shown in FIG. 4E. Note that when comparing this view to the view of rail-stack 5 of FIG. 3, the view in FIG. 4E is taken from the side and consequently shows the individual rail-stacks. To form the rail-stacks, conventional photolithographic masking and etching processes can be used, including, for instance, plasma etching. Etchants can be used that stop on anti-fuse layer 51 and deposited dielectric material described above, thus preventing this layer from being etched away. Thus, anti-fuse layer 51 and the deposited dielectric material can be considered an etchant stop layer depending on the specific etchants used.

Figure 4F:
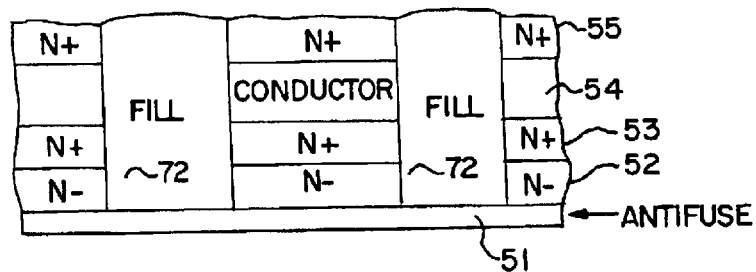

Next, as shown in FIG. 4F, the spaces between the rail-stacks are filled with a dielectric material. The dielectric material can be deposited by several dielectric deposition techniques, including a high-density-plasma-chemical-vapor-deposition (HDPCVD) process. Alternatively, the previously-described plasma oxidation process can be used to form a passivation layer on the rail stacks. The fill material can also act as a passivation film. The fill layer directly overlies oxidizable surfaces and, as such, the inventive plasma oxidation process can be advantageously used to form a portion of the fill layer illustrated in FIG. 4F.

Figure 4G:
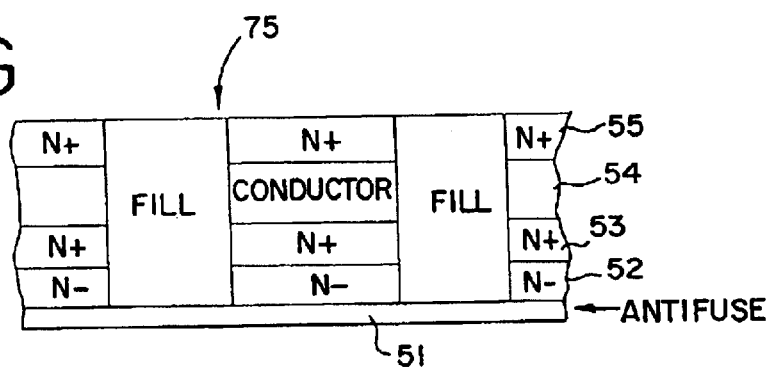

After depositing the dielectric fill, in one embodiment, a CMP process is employed to planarize the upper surface of the rail-stacks, as shown in FIG. 4G. Chemical etching can also be used as mentioned with certain dielectrics. The planarization process can reduce the thickness of semiconductor layer 55 to approximately 500 Å, thus this layer can be approximately the same thickness as semiconductor layer 53.

Figure 4H:
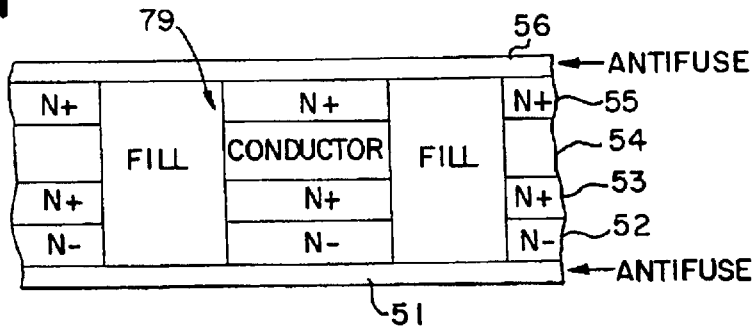

Next, as shown in FIG. 4H, another anti-fuse layer 56 is formed on the planarized surface 75. Anti-fuse layer 56 is formed using the HDP oxidation process described above.

It should be noted that in FIG. 3, while the anti-fuse layer is shown as a blanket layer covering the rail-stacks and fill, on each level the anti-fuse layer is grown from an underlying semiconductor layer. For example, in the case where semiconductor layers are silicon layer, the previously described HDP oxidation process is used to grow a silicon dioxide layer from layers 41, 47, 55 and 64.

In all the embodiments, the rail-stacks and rails are connected to circuitry in the substrate, such as decoders, sense amps and similar peripheral circuits. Vias for providing these connections are described in co-pending, commonly-assigned U.S. patent application Ser. No. 09/746, 341, entitled "Contact and Via Structure and Method of Fabrication," the disclosure of which is incorporated by reference herein.

Figure 5:
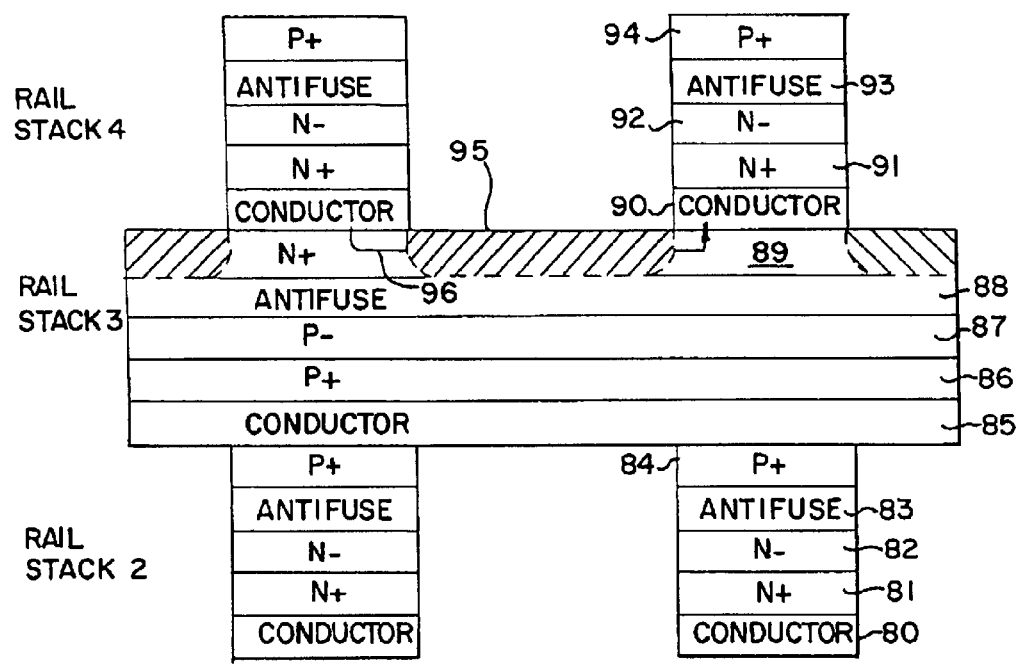
FIG. 5 illustrates a cross-sectional elevation view of another memory array.

In the memory array illustrated in FIG. 5, each rail-stack begins with a conductor such as conductor layer 80. An n+ semiconductor layer 81 and an n− semiconductor layer 82 are formed on conductor layer 80. Next, an anti-fuse layer 83 is formed using the HDP oxidation process described above. Then, a p+ semiconductor layer 84, which can be silicon doped with boron, is deposited on anti-fuse layer 83. When the rail-stacks are formed, such as rail-stack 2, anti-fuse layer 83 is etched as well as layers 80, 81, 82 and 84.

The voids between the rail-stacks are now filled and a planarization process is performed to planarize the fill with the upper surface of semiconductor layer 84. Following the completion of rail-stack 2, rail-stacks 3 are formed, as shown in FIG. 5. Rail-stacks 3 comprise a conductor layer 85, p+ semiconductor layer 86, p− semiconductor layer 87, anti-fuse layer 88 and n+ semiconductor layer 89. Again, masking and etching processes are carried out to pattern the rail-stack. The etching process also etches the exposed regions of semiconductor layer 84, which does not appear in the view of FIG. 5, but this will be apparent shortly when region 95 of the next stack is discussed. After forming rail-stacks 3, filling and planarization steps are carried out and rail-stacks 4 are formed. Rail-stacks 4 comprise a conductive layer 90, n+ semiconductor layer 91, n− semiconductor layer 92, anti-fuse layer 93, and p+ semiconductor layer 94. Once masking, etching, filling and planarization steps are carried out.

Unlike the fabrication process for the memory array illustrated in FIG. 3, here, when rail-stacks at any particular height are formed, etching must occur on one layer of the rail-stack immediately below the rail-stack being defined. For instance, when rail-stack 4 is etched semiconductor layer 89 of rail-stack 3 is etched away where it is not covered by rail-stack 4 as shown by shaded region 95. The etching process is used to remove all of the semiconductor material between the adjacent conductors, and, consequently, prevents a possible current path, such as path 96, shown in FIG. 5.

In similarity with the process embodiment described above, anti-fuse layer 88 can optionally be used as an etchant stop. No harm is done if etching does occur through the portions of anti-fuse layer 88 away from the intersection of the rail-stacks, since the anti-fuse layer is only needed at the intersections of the rail-stacks. Because the process is self-aligned, the etching of region 95 is in alignment with overlying rail-stacks and consequently no additional masking is required.

Consistent with the memory array of FIG. 3, the order of the n and p doped semiconductor layers alternate with each successive rail-stack. Moreover, the rail-stacks at any given level include both p and n semiconductor layers. In contrast with the memory array of FIG. 3, at any particular level, the rail-stacks shown in the memory array of FIG. 5 are doped with either an n type or p type dopant, but not both.

Some of the memory arrays described above have both p−n+ and p+n− diodes. In some processes, one of these diodes may exhibit more leakage than the other. Consequently, it may be desirable to have an array with only a single kind of diode. For example, an array may have higher leakage with diodes that are p−n+ type than with diodes of the p+n− type.

Figure 6:
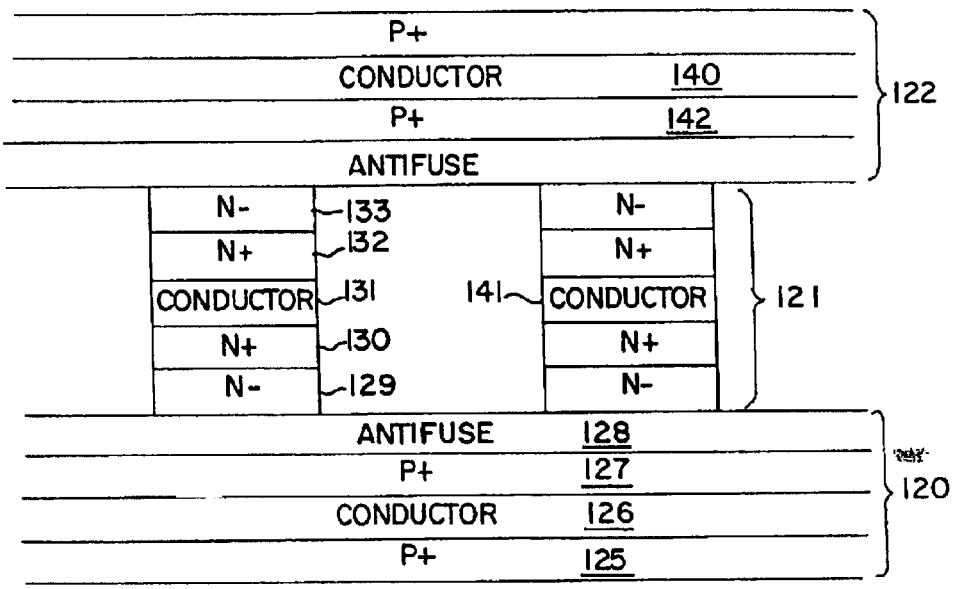
FIG. 6 illustrates a cross-sectional elevation view of a yet another memory array.

FIG. 6 illustrates a memory array where, if the anti-fuse layer is breached, all the diodes will be p+n− type, that is, there will be no diodes with a p−n+ junction. In the memory array of FIG. 6, three rail-stacks 120, 121, and 122 are illustrated which will create only a single type diode, specifically p+n− diodes. Rail-stack 120 comprises, for example: a p+ semiconductor layer 25, about 1,000 Å thick; a conductor 126 about 500 Å thick; a p+ semiconductor layer 127 about 1,000 Å thick; and an anti-fuse layer 128 approximately 30 Å thick. These layers may be formed as discussed above. Rail-stack 121 comprises, for example: an n− semiconductor layer 129 about 2,000 Å thick; an n+ semiconductor layer 130 about 500 Å thick; a conductor 131 about 500 Å thick; an n+ semiconductor layer 132 about 500

Å thick; and an n− semiconductor layer 133 about 2,000 Å thick. The rail-stack 122 has the same layering as the rail-stack 120.

As discussed above, the semiconductor layers may be formed using poly silicon or an amorphous silicon. The conductors may be a highly doped silicon or a metal, metal alloy, silicide or combinations thereof. The dielectric fill in the spaces between the rail-stacks is also used as discussed for the earlier embodiments.

As can be seen from FIG. 6, if anti-fuse layer 128 is breached, the diodes between the conductors 126 and 131 are all p+n− type, and similarly, the diodes in the next level between conductors 131 and 140 are again all p+n− type. The rail-stacks shown are used throughout the memory array so that the entire array has only p+n− type diodes in its memory cells.

The diodes in the illustrated rail-stacks of FIG. 6 are forward biased towards the conductor 131 and the conductor 141. If need be for a particular application, the diodes can be oriented identically, that is, with all their anodes (or cathodes) pointing upwardly. This can be obtained for the p+n− type diodes by having both a p+ doped and an n− doped semiconductor layer in each of the rail-stacks. For instance, layer 132 and 133 would be replaced with a p+ layer and layer 142 would be replaced with n− and n+ layers. This still maintains only one type of diode (p+n−) throughout the array.

While FIG. 6 shows that, after the anti-fuse is breached, only p+n− diodes will be created, an array with only p−n+ type diodes can be fabricated by replacing the p+ layers with an n+ layer and replacing the n+ and n− layers with p+ and p− layers. Also, the array can have the anodes (or cathodes) vertically aligned as discussed above for the p+n− type diodes.

It should be noted that for the embodiment of FIG. 6, planarization occurs on an n− layer, for example, n− semiconductor layer 133 is planarized before the formation of anti-fuse layer of rail-stack 122. For this reason, semiconductor layer 133 is somewhat thicker than, for example, semiconductor layer 132. More care is required in the polishing of layer semiconductor layer 133 to assure uniformity across the wafer and to obtain uniform diode characteristics. In this connection, a "hard" mask may be used, such as described in co-pending, commonly-assigned, U.S. patent application Ser. No. 09/746,469, filed by N. Johan Knall and James M. Cleeves, and titled "Methods Of Forming Nonvolatile Memory Devices Utilizing A Hard Mask," the disclosure of which is incorporated by reference herein. One result of having thicker n− layers is that rail-stack 121 is thicker than the rail-stacks 120 and 122.

By way of example, the material parameters of Table 1 have also been found suitable in fabricating the semiconductor structure of FIG. 6.

TABLE 1

Material Parameters for the semiconductor structure of FIG. 6

| Layer | Material | Thickness (Å) | Dopant | Dopant Concentration (atoms/cm$^3$) |
|---|---|---|---|---|
| 125 | poly Si | 1500 | Boron | >1 × 10$^{20}$ |
| 126 | TiS$_2$ | 500 | | |
| 127 | poly Si | 2000 | Boron | >1 × 10$^{20}$ |
| 128 | SiO$_2$ | 15–30 | | |
| 129 | poly Si | 2000 | Phosphorous | 1 × 10$^{17}$ |

TABLE 1-continued

Material Parameters for the semiconductor structure of FIG. 6

| Layer | Material | Thickness (Å) | Dopant | Dopant Concentration (atoms/cm$^3$) |
|---|---|---|---|---|
| 130 | poly Si | 500 | Phosphorous | >1 × 10$^{20}$ |
| 131 | TiS$_2$ | 500 | | |
| 132 | poly Si | 500 | Phosphorous | >1 × 10$^{20}$ |

When plasma techniques are used to form the anti-fuse layer 128, good results have been found using a Novellus Speed chamber operated at a plasma power of 2000 watts, with a plasma treatment time of five seconds, an O$_2$ flow of 50 sccm, and an argon flow of 500 sccm through the plasma treatment chamber.

Figure 7:
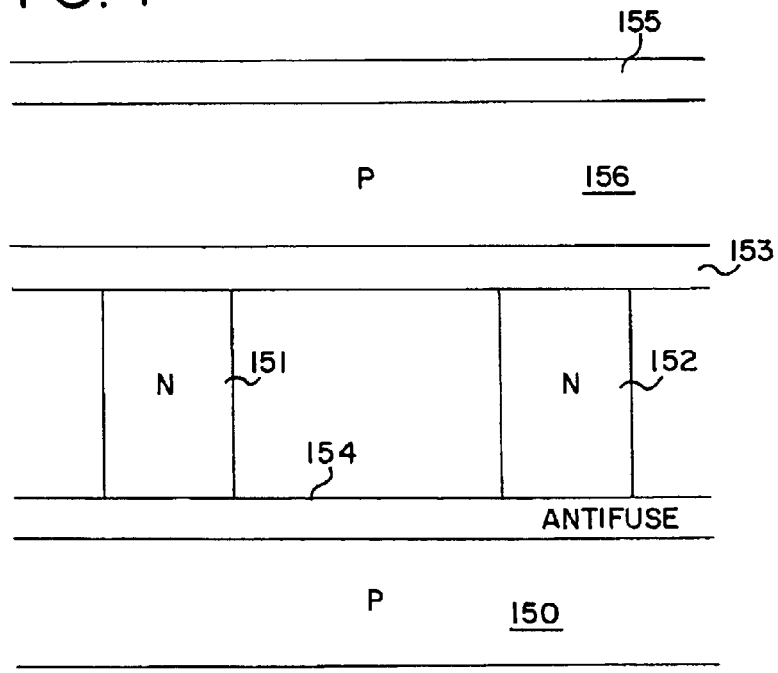
FIG. 7 illustrates a cross-sectional elevation view of a memory array employing rails.

Another memory array having a single type diode junction is illustrated in FIG. This memory array employs rails of a uniformly doped semiconductor material, rather than the composite rail-stacks previously described More specifically, as shown in FIG. 7, rails 150 of, for example, a poly silicon doped with a p− type dopant, are defined from a layer of poly silicon. In similarity with processes used to fabricate the rail-stacks described above the spaces between rails 150 are filled with a dielectric material and planarized. Then, an anti-fuse layer 154 is formed using the HDP oxidation process described above.

Next, an n− type poly silicon layer is formed on anti-fuse layer 154 and orthogonal rails 151 and 152 formed by photolithography and etching processes. Then, following a dielectric fill step and a planarization step, another anti-fuse layer 153 is formed using the HDP oxidation process described above. Next, p− type poly silicon rails 156 are formed and an anti-fuse layer 155 is formed on rails 156 using the HDP oxidation process described above.

Each of the poly silicon rails 150, 151, 152, and 156 and like rails at other levels are connected to circuitry in a substrate. Each of the rails is both a conductor and one-half a diode (a diode component) for cells. For instance, a cell is formed between rail 156 and rail 151, and another cell between rail 156 and rail 152. Likewise, cells are formed between the rail 150 and each of the rails, 151 and 152.

An advantage of the memory array illustrated in FIG. 7 is its ease of fabrication. However, typically, the semiconductor rails are less conductive than the metal conductors previously described, and, consequently, the rails will have more electrical resistance. Greater electrical resistance will increase the access time of the cells, particularly in a large memory array. The conductivity of the rails can be improved by increasing the concentration of the p type and n type dopants. However, when this is done, the leakage current can also increase. For any given array, decreased resistance can be traded-off for increased leakage and vice-versa. It is contemplated that this memory array will typically be used in a relatively small device where high-speed access is not critical.

As can be seen from FIG. 7, after the anti-fuse is breached, the diodes associated with each of the cells are the same; specifically the p and n type dopant concentrations for each diode is the same.

The processes described above can be applied to the fabrication of memory arrays having architecture that is different from that described above. For example, in the memory arrays described above, two cells share a conductor. However, an array may also be fabricated that incorporates two conductors for each cell that are not shared with other cells. A dielectric may be used to separate each such cell. Also, while above diodes formed in alternate cells "point" in the same direction in some of the memory arrays, this is not necessary. For example, a shared conductor may have that diodes point-in from above and point-out from below. However, such a memory array requires different driving circuitry in the substrate than that used for the memory arrays illustrated above.

The HDP oxidation process can be used to form anti-fuse layers in a variety of memory devices. For example, a vertically stacked field programmable memory array is described in commonly-assigned U.S. Pat. No. 6,034,882, entitled "Vertically Stacked Field Programmable Nonvolatile Memory And Method Of Fabrication," the disclosure of which is incorporated by reference herein. In the memory array disclosed, each memory cell includes vertically separated input and output terminals. The input and output terminals can be formed by metal conductors. The pillars are comprised of a steering element and a state change element, where the state change element overlies the steering element. The state change element can be formed by a dielectric rupture anti-fuse layer positioned intermediate to two semiconductor layers. The HDP oxidation process described above can be used to form the dielectric rupture anti-fuse of the state change element.

Thus it is apparent that there has been disclosed a dielectric film using a high density plasma oxidation process that fully provides the advantages set forth above. Although the process has been described and illustrated with reference to specific illustrative embodiments thereof, it is not intended that the invention be limited to those illustrative embodiments. Those skilled in the art will recognize that variations and modifications can be made without departing from the spirit of the invention. For example, the process can be used to fabricate a wide variety of components in an integrated circuit device beyond those described in the illustrative embodiments. It is therefore intended to include within the invention all such variations and modification as fall within the scope of the appended claims.

As used herein the term "set" is intended broadly to encompass one or more. Thus, a set of layers can include one, two, three or more layers.

As used herein, the term "conductor" is intended broadly to include both metallic conductors and doped semiconductors. The term "film" is intended broadly to include layers of varying thicknesses, and the term "rupture" is intended broadly to encompass partial or complete rupture of an antifuse layer.

The term "coupled with" is intended broadly to include both direct and indirect coupling. Thus, a first element is said to be coupled with second element whether or not there are intervening, unnamed components. For example, the voltage source described above is said to be coupled with memory cell even though intervening switching elements operate to electrically connect the voltage source to the memory cell only intermittently or only occasionally.

The foregoing detailed description has discussed only a few of the many forms that this invention can take. For this reason, this detailed description is intended by way of illustration and not by way of limitation. It is only the following claims, including all equivalents, that are intended to define the scope of this invention.

What is claimed is:

1. A memory cell comprising:

a first conductor;

a second conductor;

a set of layers situated between the first and second conductors, said set of layers comprising an anti-fuse layer characterized by a first conductivity prior to anti-fuse layer rupture;

said memory cell comprising first and second diode components coupled in series with the anti-fuse layer, said diode components characterized by a second conductivity when reverse biased prior to anti-fuse layer rupture;

said first conductivity being greater than 25% of said second conductivity.

2. The invention of claim 1 wherein said first conductivity is greater than 50% of said second conductivity.

3. The invention of claim 1 wherein said first conductivity is greater than 100% of said conductivity.

4. The invention of claim 1 wherein the anti-fuse layer has a thickness less than 35 Å.

5. The invention of claim 1 wherein the anti-fuse layer has a thickness less than 25 Å.

6. The invention of claim 1 wherein the anti-fuse layer, prior to rupture, is characterized by a leakage current density greater than 1 mA/cm$^2$ at 2V.

7. The invention of claim 1 wherein the anti-fuse layer, prior to rupture, is characterized by a leakage current density greater than 10 mA/cm$^2$ at 2V.

8. The invention of claim 1 wherein the anti-fuse layer, prior to rupture, is characterized by a leakage current density greater than 100 mA/cm$^2$ at 2V.

9. The invention of claim 1 wherein the diode components are situated on opposite sides of the anti-fuse layer.

10. The invention of claim 1, 4, 7, or 9 wherein the diode components comprise poly silicon.

11. The invention of claim 1 wherein one of the diode components comprises a polished surface, and wherein the anti-fuse layer is grown on the polished surface.

12. The invention of claim 1 wherein the anti-fuse layer comprises an oxide of silicon.

13. A memory array comprising a plurality of the memory cells of claim 1, wherein the memory cells are arranged in a plurality of two-dimensional layers, and wherein the two-dimensional layers of memory cells are stacked to form a three-dimensional array.

14. A memory cell comprising:

a first conductor;

a second conductor;

a set of layers situated between the first and second conductors, said set of layers comprising an anti-fuse layer having a thickness less than 35 Å.

15. The invention of claim 14 wherein the memory cell comprises a p-type semiconductor layer on one side of the anti-fuse layer and an n-type semiconductor layer on another side of the anti-fuse layer, opposite the one side.

16. The invention of claim 15 wherein the semiconductor layers both comprise poly silicon.

17. The invention of claim 16 wherein the semiconductor layers comprise respective diode components that cooperate to form a diode when the anti-fuse layer is ruptured.

18. The invention of claim 15 wherein one of the semiconductor layers comprises a polished surface, and wherein the anti-fuse layer is grown on the polished surface.

19. A memory cell comprising:

a first conductor;

a second conductor;

a set of layers situated between the first and second conductors, said set of layers comprising an anti-fuse layer having a thickness less than 35 Å;

wherein the anti-fuse layer, prior to rupture, is characterized by a leakage current density greater than 1 mA/cm$^2$ at 2V.

20. A memory cell comprising:

a first conductor;

a second conductor;

a set of layers situated between the first and second conductors, said set of layers comprising an anti-fuse layer having a thickness less than 35 Å;

wherein the anti-fuse layer, prior to rupture, is characterized by a leakage current density greater than 10 mA/cm$^2$ at 2V.

21. A memory cell comprising:

a first conductor;

a second conductor;

a set of layers situated between the first and second conductors, said set of layers comprising an anti-fuse layer having a thickness less than 35 Å;

wherein the anti-fuse layer, prior to rupture, is characterized by a leakage current density greater than 100 mA/cm$^2$ at 2V.

22. A memory array comprising a plurality of the memory cells of claim 16, wherein the memory cells are arranged in a plurality of two-dimensional layers, and wherein the two-dimensional layers of memory cells are stacked to form a three-dimensional array.

23. The invention of claim 14 or 16 wherein the anti-fuse layer comprises an oxide of silicon.

24. The invention of claim 14 wherein the thickness is less than 30 Å.

25. The invention of claim 14 wherein the thickness is less than 20 Å.

26. A memory cell comprising:

a first conductor;

a second conductor;

a set of layers situated between the first and second conductors, said set of layers comprising an anti-fuse layer having a leakage current density, prior to rupture, greater than 1 mA/cm$^2$ at 2V.

27. The invention of claim 26 wherein the leakage current density is greater than 10 mA/cm$^2$ at 2V.

28. The invention of claim 26 wherein the leakage current density is greater than 100 mA/cm$^2$ at 2V.

29. The invention of claim 26 wherein the memory cell comprises a p-type semiconductor layer on one side of the anti-fuse layer and an n-type semiconductor layer on another side of the anti-fuse layer, opposite the one side.

30. The invention of claim 29 wherein the semiconductor layers both comprise poly silicon.

31. The invention of claim 30 wherein the semiconductor layers comprise respective diode components that cooperate to form a diode when the anti-fuse layer is ruptured.

32. The invention of claim 29 wherein one of the semiconductor layers comprises a polished surface, and wherein the anti-fuse layer is grown on the polished surface.

33. A memory array comprising a plurality of the memory cells of claim 26 or 29, wherein the memory cells are arranged in a plurality of two-dimensional layers, and wherein the two-dimensional layers of memory cells are stacked to form a three-dimensional array.

34. The invention of claim 26 or 30 wherein the anti-fuse layer comprises an oxide of silicon.

35. A memory cell comprising:

a first conductor;

a second conductor;

a set of layers situated between the first and second conductors, said set of layers comprising an antifuse layer comprising a selected antifuse material formed in a film of average thickness T;

said memory cell comprising first and second diode components coupled in series with the antifuse layer;

a voltage source coupled with the first and second conductors and operative to apply a plurality of write pulses to the memory cell;

said antifuse material characterized by a thickness $T_{minlife}$ at which the antifuse material is ruptured by a minimum number of the write pulses having a polarity that reverse biases the diode components;

said average thickness T being less than said thickness $T_{minlife}$.

36. The invention of claim 35 wherein the antifuse material comprises $SiO_2$, wherein the thickness $T_{minlife}$ is substantially equal to 35 Å, and wherein the average thickness T is no greater than 32 Å.

37. The invention of claim 36 wherein T is no less than 20 Å.

38. The invention of claim 35 wherein the write pulses are characterized by a write voltage in excess of about 8V.

39. A three dimensional memory comprising a plurality of the memory cells of claim 35 arrayed in a plurality of two-dimensional layers of memory cells, wherein the two-dimensional layers of memory cells are vertically stacked to form the three-dimensional memory.

* * * * *